(12) United States Patent
Du (10) Patent No.: US 9,536,840 B2
(45) Date of Patent: Jan. 3, 2017

(54) THREE-DIMENSIONAL (3-D) INTEGRATED CIRCUITS (3DICS) WITH GRAPHENE SHIELD, AND RELATED COMPONENTS AND METHODS

(71) Applicant: QUALCOMM Incorporated, San Diego, CA (US)

(72) Inventor: Yang Du, Carlsbad, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 13/765,061

(22) Filed: Feb. 12, 2013

(65) Prior Publication Data

US 2014/0225235 A1    Aug. 14, 2014

(51) Int. Cl.

| | |
|---|---|
| *H01L 23/552* | (2006.01) |
| *H01L 23/373* | (2006.01) |
| *H01L 27/06* | (2006.01) |
| *H01L 23/522* | (2006.01) |
| *H01L 25/065* | (2006.01) |
| *H01L 25/00* | (2006.01) |

(52) U.S. Cl.
CPC ........... *H01L 23/552* (2013.01); *H01L 23/373* (2013.01); *H01L 23/5225* (2013.01); *H01L 27/0688* (2013.01); *H01L 25/0657* (2013.01); *H01L 25/50* (2013.01); *H01L 2924/0002* (2013.01)

(58) Field of Classification Search
None
See application file for complete search history.

(56) References Cited

U.S. PATENT DOCUMENTS

| | | |
|---|---|---|
| 5,606,186 A | 2/1997 | Noda |
| 5,636,125 A | 6/1997 | Rostoker et al. |
| 5,724,557 A | 3/1998 | McBean, Sr. |
| | (Continued) | |

FOREIGN PATENT DOCUMENTS

| | | |
|---|---|---|
| EP | 1432032 A2 | 6/2004 |
| EP | 2551898 A1 | 1/2013 |
| | (Continued) | |

OTHER PUBLICATIONS

Co-pending U.S. Appl. No. 13/784,915, filed Mar. 5, 2013.

(Continued)

*Primary Examiner* — Michael Jung
*Assistant Examiner* — Jay C Chang
(74) *Attorney, Agent, or Firm* — Withrow + Terrnova, PLLC (57) ABSTRACT

A three-dimensional (3-D) integrated circuit (3DIC) with a graphene shield is disclosed. In certain embodiments, at least a graphene layer is positioned between two adjacent tiers of the 3DIC. A graphene layer is a sheet like layer made of pure carbon, at least one atom thick with atoms arranged in a regular hexagonal pattern. A graphene layer may be disposed between any number of adjacent tiers in the 3DIC. In exemplary embodiments, the graphene layer provides an electromagnetic interference shield between adjacent tiers or layers in the 3DIC to reduce crosstalk between the tiers. In other exemplary embodiments, the graphene layer(s) can be disposed in the 3DIC to provide a heat sink that directs and dissipates heat to peripheral areas of the 3DIC. In some embodiments, the graphene layer(s) are configured to provide both EMI shielding and heat shielding.

15 Claims, 8 Drawing Sheets

(56) References Cited

U.S. PATENT DOCUMENTS

| | | |
|---|---|---|
| 6,040,203 A | 3/2000 | Bozso et al. |
| 6,125,217 A | 9/2000 | Paniccia et al. |
| 6,260,182 B1 | 7/2001 | Mohan et al. |
| 6,295,636 B1 | 9/2001 | Dupenloup |
| 6,305,001 B1 | 10/2001 | Graef |
| 6,374,200 B1 | 4/2002 | Nakagawa |
| 6,448,168 B1 | 9/2002 | Rao et al. |
| 6,627,985 B2 | 9/2003 | Huppenthal et al. |
| 6,727,530 B1 | 4/2004 | Shen et al. |
| 6,754,877 B1 | 6/2004 | Srinivasan |
| 6,834,380 B2 | 12/2004 | Khazei |
| 6,846,703 B2 | 1/2005 | Shimoda et al. |
| 6,965,527 B2 | 11/2005 | Fasoli et al. |
| 6,979,630 B2 | 12/2005 | Walitzki |
| 7,107,200 B1 | 9/2006 | Korobkov |
| 7,173,327 B2 | 2/2007 | Siniaguine |
| 7,209,378 B2 | 4/2007 | Nejad et al. |
| 7,280,397 B2 | 10/2007 | Scheuerlein |
| 7,288,418 B2 | 10/2007 | Barge et al. |
| 7,298,641 B2 | 11/2007 | Madurawe et al. |
| 7,356,781 B2 | 4/2008 | Koeder et al. |
| 7,459,716 B2 | 12/2008 | Toda et al. |
| 7,546,571 B2 | 6/2009 | Mankin et al. |
| 7,579,654 B2 | 8/2009 | Couillard et al. |
| 7,622,955 B2 | 11/2009 | Vilangudipitchai et al. |
| 7,653,884 B2 | 1/2010 | Furnish et al. |
| 7,663,620 B2 | 2/2010 | Robertson et al. |
| 7,669,152 B1 | 2/2010 | Tcherniaev et al. |
| 7,796,092 B2 | 9/2010 | Holly et al. |
| 7,877,719 B2 | 1/2011 | He |
| 7,964,916 B2 | 6/2011 | Or-Bach et al. |
| 7,969,193 B1 | 6/2011 | Wu et al. |
| 7,989,226 B2 | 8/2011 | Peng |
| 8,006,212 B2 | 8/2011 | Sinha et al. |
| 8,026,521 B1 | 9/2011 | Or-Bach et al. |
| 8,046,727 B2 | 10/2011 | Solomon |
| 8,059,443 B2 | 11/2011 | McLaren et al. |
| 8,060,843 B2 | 11/2011 | Wang et al. |
| 8,114,757 B1 | 2/2012 | Or-Bach et al. |
| 8,115,511 B2 | 2/2012 | Or-Bach |
| 8,136,071 B2 | 3/2012 | Solomon |
| 8,146,032 B2 | 3/2012 | Chen et al. |
| 8,164,089 B2 | 4/2012 | Wu et al. |
| 8,208,282 B2 | 6/2012 | Johnson et al. |
| 8,218,377 B2 | 7/2012 | Tandon et al. |
| 8,222,696 B2 | 7/2012 | Yamazaki et al. |
| 8,230,375 B2 | 7/2012 | Madurawe |
| 8,258,810 B2 | 9/2012 | Or-Bach et al. |
| 8,298,875 B1 | 10/2012 | Or-Bach et al. |
| 8,332,803 B1 | 12/2012 | Rahman |
| 8,450,804 B2 | 5/2013 | Sekar et al. |
| 8,576,000 B2 | 11/2013 | Kim et al. |
| 8,683,416 B1 | 3/2014 | Trivedi et al. |
| 8,701,073 B1 | 4/2014 | Fu et al. |
| 8,803,206 B1 | 8/2014 | Or-Bach et al. |
| 8,803,233 B2 | 8/2014 | Cheng et al. |
| 8,984,463 B2 | 3/2015 | Xie et al. |
| 9,041,448 B2 | 5/2015 | Du et al. |
| 9,171,608 B2 | 10/2015 | Xie et al. |
| 2004/0036126 A1 | 2/2004 | Chau et al. |
| 2004/0113207 A1 | 6/2004 | Hsu et al. |
| 2004/0141348 A1 | 7/2004 | Shau |
| 2004/0241958 A1 | 12/2004 | Guarini et al. |
| 2005/0280061 A1 | 12/2005 | Lee |
| 2006/0190889 A1 | 8/2006 | Cong et al. |
| 2006/0263977 A1* | 11/2006 | Kim .............. H01L 28/84 438/253 |
| 2007/0040221 A1 | 2/2007 | Gossner et al. |
| 2007/0147157 A1 | 6/2007 | Luo et al. |
| 2007/0244676 A1 | 10/2007 | Shang et al. |
| 2008/0276212 A1 | 11/2008 | Albrecht |
| 2008/0283995 A1 | 11/2008 | Bucki et al. |
| 2008/0291767 A1 | 11/2008 | Barnes et al. |
| 2009/0045487 A1* | 2/2009 | Jung .............. H01L 21/76898 257/621 |
| 2009/0174032 A1 | 7/2009 | Maejima et al. |
| 2009/0302394 A1 | 12/2009 | Fujita |
| 2009/0305462 A1 | 12/2009 | Bucki et al. |
| 2010/0115477 A1 | 5/2010 | Albrecht et al. |
| 2010/0140790 A1 | 6/2010 | Setiadi et al. |
| 2010/0193770 A1 | 8/2010 | Bangsaruntip et al. |
| 2010/0229142 A1 | 9/2010 | Masleid et al. |
| 2010/0276662 A1 | 11/2010 | Colinge |
| 2011/0001247 A1* | 1/2011 | Jobetto ............... H01L 21/486 257/774 |
| 2011/0049594 A1* | 3/2011 | Dyer et al. ............ 257/296 |
| 2011/0053332 A1 | 3/2011 | Lee |
| 2011/0059599 A1 | 3/2011 | Ward et al. |
| 2011/0078222 A1 | 3/2011 | Wegener |
| 2011/0084314 A1 | 4/2011 | Or-Bach et al. |
| 2011/0121366 A1 | 5/2011 | Or-Bach et al. |
| 2011/0215300 A1 | 9/2011 | Guo et al. |
| 2011/0221502 A1 | 9/2011 | Meijer et al. |
| 2011/0222332 A1 | 9/2011 | Liaw et al. |
| 2011/0253982 A1 | 10/2011 | Wang et al. |
| 2011/0272788 A1 | 11/2011 | Kim et al. |
| 2011/0280076 A1 | 11/2011 | Samachisa et al. |
| 2011/0298021 A1 | 12/2011 | Tada et al. |
| 2012/0012972 A1 | 1/2012 | Takafuji et al. |
| 2012/0056258 A1 | 3/2012 | Chen |
| 2012/0129276 A1 | 5/2012 | Haensch et al. |
| 2012/0129301 A1 | 5/2012 | Or-Bach et al. |
| 2012/0133061 A1* | 5/2012 | Mitsukura .......... C08G 73/1039 257/798 |
| 2012/0152322 A1 | 6/2012 | Kribus et al. |
| 2012/0171108 A1* | 7/2012 | Kim et al. .............. 423/448 |
| 2012/0181508 A1 | 7/2012 | Chang et al. |
| 2012/0182654 A1 | 7/2012 | Wang et al. |
| 2012/0187486 A1 | 7/2012 | Goto et al. |
| 2012/0193621 A1 | 8/2012 | Or-Bach et al. |
| 2012/0195136 A1 | 8/2012 | Yoko |
| 2012/0217479 A1 | 8/2012 | Chang et al. |
| 2012/0280231 A1 | 11/2012 | Ito et al. |
| 2012/0286822 A1 | 11/2012 | Madurawe |
| 2012/0304142 A1 | 11/2012 | Morimoto et al. |
| 2012/0305893 A1 | 12/2012 | Colinge |
| 2012/0306082 A1* | 12/2012 | Sekar et al. ............ 257/758 |
| 2012/0313227 A1 | 12/2012 | Or-Bach et al. |
| 2013/0026539 A1 | 1/2013 | Tang et al. |
| 2013/0026608 A1 | 1/2013 | Radu |
| 2013/0105897 A1 | 5/2013 | Bangsaruntip et al. |
| 2013/0148402 A1 | 6/2013 | Chang et al. |
| 2013/0240828 A1 | 9/2013 | Ota et al. |
| 2013/0299771 A1 | 11/2013 | Youn et al. |
| 2014/0008606 A1 | 1/2014 | Hussain et al. |
| 2014/0035041 A1 | 2/2014 | Pillarisetty et al. |
| 2014/0084444 A1* | 3/2014 | Lin .................. 257/698 |
| 2014/0085959 A1 | 3/2014 | Saraswat et al. |
| 2014/0097868 A1 | 4/2014 | Ngai |
| 2014/0225218 A1 | 8/2014 | Du |
| 2014/0269022 A1 | 9/2014 | Xie et al. |
| 2015/0132922 A1 | 5/2015 | Du |
| 2015/0302919 A1 | 10/2015 | Xie et al. |

FOREIGN PATENT DOCUMENTS

| | | |
|---|---|---|
| FR | 2973938 A1 | 10/2012 |
| JP | H06204810 A | 7/1994 |
| JP | H097373 A | 1/1997 |
| JP | 2001160612 A | 6/2001 |
| JP | 2003224211 A | 8/2003 |
| JP | 2009259392 A | 11/2009 |
| JP | 2009260364 A | 11/2009 |
| KR | 20010109790 A | 12/2001 |
| KR | 20080038535 A | 5/2008 |
| WO | 2011112300 A1 | 9/2011 |
| WO | 2012113898 A1 | 8/2012 |
| WO | 2013045985 A1 | 4/2013 |

OTHER PUBLICATIONS

Co-pending U.S. Appl. No. 13/788,224, filed Mar. 7, 2013.
Co-pending U.S. Appl. No. 13/792,384, filed Mar. 11, 2013.

(56) References Cited

OTHER PUBLICATIONS

Co-pending U.S. Appl. No. 13/792,486, filed Mar. 11, 2013.
Co-pending U.S. Appl. No. 13/792,592, filed Mar. 11, 2013.
Fujio I. et al., "Level Conversion for Dual-Supply Systems", IEEE Transactions on Very Large Scale Integration (VLSI) Systems, vol. 12, No. 2, Feb. 2004, pp. 185-195.
Mototsugu H. et al., "A Top-Down Low Power Design Technique Using Clustered Voltage Scaling with Variable Supply-Voltage Scheme", IEEE 1998 Custom Integrated Circuits Conference, pp. 495-498.
Gong., et al., "Three Dimensional System Integration", Springer, IC Stacking Process and Design, Jan. 2011; ISBN 978-1-4419-0962-6; pp. 1-246.
Arunachalam V., et al., "Low-power clock distribution in microprocessor", Proceedings of the 18th ACM Great Lakes Symposium on VLSI, GLSVLSI '08, Jan. 1, 2008 (Jan. 1, 2008), 3 pages, XP055106715, New York, USA DOI: 10.1145/1366110.1366212 ISBN: 978-1-59-593999-9 p. 429-p. 434.
Donno M., et al., "Power-aware clock tree planning", Proceedings of the 2004 International Symposium on Physical Design, ISPD '04, Jan. 1, 2004 (Jan. 1, 2004), 5 pages, XP055106989, New York, New York, USA DOI: 10.1145/981066.981097 ISBN: 978-1-58-113817-7 p. 140-p. 144.
Ganguly S., et al., "Clock distribution design and verification for PowerPC microprocessors", Computer-Aided Design, 1997, Digest of Technical Papers., 1997 IEEE/AC M International Conference on San Jose, CA, USA Nov. 9-13, 1997, Los Alamitos, CA, USA, IEEE Comput. Soc, US, Nov. 5, 1995 (Nov. 5, 1995), pp. 58-61, XP032372227, DOI: 10.1109/ICCAD.1995.479991 ISBN: 978-0-8186-8200-1 p. 58-p. 61.
International Search Report and Written Opinion—PCT/US2014/015279—ISA/EPO—Apr. 22, 2014.
Tsao C.W.A., et al., "UST/DME: a clock tree router for general skew constraints", Computer Aided Design, 2000, ICCAD-2000, IEEE/ACM International Conference on, IEEE, Nov. 5, 2000 (Nov. 5, 2000), pp. 400-405, XP032402965, DOI: 10.1109/ICCAD.2000.896505 ISBN: 978-0-7803-6445-5 p. 400-p. 401.
Xie J., et al., "CPDI: Cross-power-domain interface circuit design in monolithic 3D technology", Quality Electronic Design (ISQED), 2013 14th International Symposium on, IEEE, Mar. 4, 2013 (Mar. 4, 2013), pp. 442-447, XP032418452, DOI: 10.1109/ISQED.2013.6523649 ISBN: 978-1-4673-4951-2 Section II. "Monolithic 3D Technology" ; figures 1,3.
Cong J. et al., "An Automated Design Flow for 3D Microarchitecture Evaluation," 11th Asia and South Pacific Design Automation Conference, Jan. 24, 2006, IEEE, pp. 384-389.

Friedman, E. G., "Clock Distribution Networks in Synchronous Digital Integrated Circuits," Proceedings of the IEEE, vol. 89, No. 5, May 2001, IEEE, pp. 665-692.
Jain A. et al., "Thermal-electrical co-optimisation of floorplanning of three-dimensional integrated circuits under manufacturing and physical design constraints," IET Computers and Digital Techniques, vol. 5, No. 3, May 2011, IET, pp. 169-178.
Khan Q.A., et al., "A Single Supply Level Shifter for Multi-Voltage Systems," IEEE Proceedings of the 19th International Conference on VLSI Design (VLSID'06), Jan. 2006, IEEE, 4 pages.
Kim, T-Y., et al., "Clock Tree Synthesis for TSV-Based 3D IC designs," ACM Transactions on Design Automation of Electronic Systems, vol. 16, No. 4, Article 48, Oct. 2011, ACM, pp. 48:1-48:21.
Kulkarni J., et al., "Capacitive-Coupling Wordline Boosting with Self-Induced VCC Collapse for Write VMIN Reduction in 22-nm 8T SRAM," IEEE International Solid-State Circuits Conference, Feb. 2012, IEEE, pp. 234-236.
Lin, C-T., et al., "CAD Reference Flow for 3D Via-Last Integrated Circuits," 15th Asia and South Pacific Design Automation Conference (ASP-DAC), Jan. 2010, IEEE, pp. 187-192.
Lin S., et al., "A New Family of Sequential Elements with Built-in Soft Error Tolerance for Dual-VDD Systems," IEEE Transactions on Very Large Scale Integration (VLSI) Systems, vol. 16, No. 10, Oct. 2008, IEEE, pp. 1372-1384.
Loh, Gabriel H. et al., "Processor Design in 3D Die-Stacking Technologies," IEEE Micro, vol. 27, No. 3, May-Jun. 2007, IEEE, pp. 31-48.
Minz J. et al., "Block-Level 3-D Global Routing With an Application to 3-D Packaging", IEEE Transactions on Computer-Aided Design of Integrated Circuits and Systems, vol. 25, No. 10, Oct. 2006, IEEE, pp. 2248-2257.
Minz, J. et al., "Channel and Pin Assignment for Three Dimensional Packaging Routing," May 24, 2004, http://www.ceres.gatech.edu/tech-reports/tr2004/git-cercs-04-21.pdf, 6 pages.
Bobba, S., et al., "Performance Analysis of 3-D Monolithic Integrated Circuits," 2010 IEEE International 3D Systems Integration Conference (3DIC), Nov. 16-18, 2010, Munich, Germany, IEEE, 4 pages.
Written Opinion for Patent Application No. PCT/US2014/015279, mailed Jan. 22, 2015, 7 pages.
International Preliminary Report on Patentability for PCT/US2014/015279, mailed May 6, 2015, 19 pages.
First Office Action for Japanese Patent Application No. 2016-501104, mailed Mar. 1, 2016, 6 pages.

* cited by examiner

THREE-DIMENSIONAL (3-D) INTEGRATED CIRCUITS (3DICS) WITH GRAPHENE SHIELD, AND RELATED COMPONENTS AND METHODS

RELATED APPLICATION

The present application is related to U.S. patent application Ser. No. 13/765,080, filed on Feb. 12, 2013, entitled "ION REDUCED, ION CUT-FORMED THREE DIMENSIONAL, INTEGRATED CIRCUITS (3DICS), AND RELATED METHODS AND SYSTEMS."

BACKGROUND

I. Field of the Disclosure

The technology of the disclosure relates to three-dimensional integrated circuits (3DICs).

II. Background

Mobile communication devices have become common in current society. The prevalence of these mobile devices is driven in part by the many functions that are now enabled on such devices. Demand for such functions increases processing capability requirements and generates a need for more powerful batteries. Within the limited space of the housing of the mobile communication device, batteries compete with the processing circuitry. These and other factors contribute to a continued miniaturization of components and power consumption within the circuitry.

Miniaturization of the components impacts all aspects of the processing circuitry including the transistors and other reactive elements in the processing circuitry. One miniaturization technique involves arranging integrated circuits in not just an x-y coordinate system, but also in a z-coordinate system. That is, current miniaturization techniques use three-dimensional (3D) integrated circuits (ICs) (3DICs) to achieve higher device packing density, lower interconnect delay, and lower costs. Currently, there are several techniques to manufacture or form 3DICs.

A first technique to form a 3DIC is selective epitaxial layer growth. Selective epitaxial layer growth can produce acceptably decent quality ICs, but this technique is expensive due to the rigorous requirements associated with the process. A second technique to form a 3DIC is a wafer-on-wafer manufacturing technique, whereby electronic components are built on two or more semiconductor wafers separately. The two or more semiconductor wafers are stacked, aligned, bonded, and diced into 3DICs. Through silicon vias (TSVs) are required and provided to effectuate electrical connections between the stacked wafers. Misalignment or TSV defects in any of the stacked wafers can result in an entirely defective integrated circuit due to the interdependence of the IC on the various layers. A third technique to form a 3DIC is a die-on-wafer technique, whereby electronic components are built on two semiconductor wafers. In this technique, one wafer is sliced and the singulated dice are aligned and bonded onto die sites of the second wafer. This die-on-wafer technique can also suffer from alignment issues. A fourth technique to form a 3DIC is a die-on-die technique whereby electronic components are built on multiple dice and then stacked, aligned, and bonded. This approach suffers from the same misalignment problem which may render the final 3DIC unusable.

A fifth technique to form a 3DIC is a monolithic technique, whereby electronic components and their connections are built in layers on a single semiconductor wafer. The layers are assembled through an ion-cutting process. The use of the layers in this fashion eliminates the need for precise alignment and TSVs. In the monolithic approach, a receptor wafer is prepared with integrated components thereon. An oxide layer forms on a top surface of the receptor wafer. A donor wafer is prepared by subjecting the donor wafer to an ion (typically hydrogen) implantation process. The surface of the donor wafer with the ion implantation is then stacked onto the oxide layer of the receptor wafer. The oxide layer of the receptor wafer bonds with the surface of the donor wafer through an annealing process. The donor wafer is then removed, transferring a silicon layer to the receptor wafer. Additional electronic components and interconnects are fabricated over the transfer silicon layer sequentially. The monolithic approach is less expensive than epitaxial growth and eliminates the risk of misalignment, resulting in more functional devices than the techniques that rely on wafer-to-wafer, wafer-to-die, or die-to-die alignment.

The monolithic approach makes integrated circuits with small footprints, but the density of active components in the three-dimensional integrated circuit generates relatively greater amounts of heat than a simple two-dimensional integrated circuit. High temperatures can negatively impact performance of the active components in the circuit. Further, by arranging the circuit in three dimensions instead of just two dimensions, new opportunities for electromagnetic interference (EMI) or crosstalk between circuits are also created. EMI also negatively impacts performance of the active components in the circuit.

SUMMARY OF THE DETAILED DESCRIPTION

Embodiments disclosed in the detailed description include three-dimensional (3-D) integrated circuits (3DICs) with a graphene shield. Related components and methods are also disclosed. In certain embodiments disclosed herein, at least a graphene layer is positioned between two adjacent tiers of the 3DIC. A graphene layer is a sheet like layer made of pure carbon, at least one atom thick with atoms arranged in a regular hexagonal pattern. A graphene layer may be disposed between any number of adjacent tiers in the 3DIC. In exemplary embodiments, the graphene layer provides an electromagnetic interference (EMI) shield between adjacent tiers or layers in the 3DIC to reduce crosstalk between the tiers. Crosstalk between components in adjacent tiers in a 3DIC can negatively impact the performance of the 3DIC. In other exemplary embodiments, the graphene layer(s) can be disposed in the 3DIC to provide a heat sink that directs and dissipates heat to peripheral areas or heat sink of the 3DIC. In some embodiments, the graphene layer(s) are configured to provide both EMI shielding and heat shielding.

In this regard in one embodiment, a monolithic 3DIC is disclosed, the 3DIC comprises a first semiconductor integrated circuit tier comprising a first component. The 3DIC also comprises a second semiconductor integrated circuit tier comprising a second component vertically positioned relative to the first semiconductor integrated circuit tier. The 3DIC also comprises at least one graphene layer disposed between the first and second semiconductor integrated circuit tiers in such a manner that the at least one graphene layer is not part of the first or second component.

In another embodiment, a monolithic three-dimensional integrated circuit is disclosed. The 3DIC comprises a first means for providing a semiconductor tier comprising a first component. The 3DIC also comprises a second means for providing a semiconductor tier comprising a second component vertically positioned relative to the first means for providing the semiconductor tier. The 3DIC also comprises at least one graphene layer disposed between the first and second means for providing semiconductor tiers in such a manner that the at least one graphene layer is not part of the first or second component.

In another embodiment a method of forming a monolithic three-dimensional integrated circuit is disclosed. The method comprises providing a first semiconductor tier comprising a first component. The method also comprises positioning at least one layer of graphene on a surface of the first semiconductor tier. The method also comprises electrically isolating the first component from the at least one layer of graphene. The method also comprises providing a second semiconductor tier comprising a second component over the at least one layer of graphene such that the at least one layer of graphene is between the first and second semiconductor tiers and the second component is electrically isolated from the at least one layer of graphene.

DETAILED DESCRIPTION

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed in the detailed description include three-dimensional (3-D) integrated circuits (3DICs) with a graphene shield. Related components and methods are also disclosed. In certain embodiments disclosed herein, at least a graphene layer is positioned between two adjacent tiers of the 3DIC. A graphene layer is a sheet like layer made of pure carbon, at least one atom thick with atoms arranged in a regular hexagonal pattern. A graphene layer may be disposed between any number of adjacent tiers in the 3DIC. In exemplary embodiments, the graphene layer provides an electromagnetic interference (EMI) shield between adjacent tiers or layers in the 3DIC to reduce crosstalk between the tiers. Crosstalk between components in adjacent tiers in a 3DIC can negatively impact the performance of the 3DIC. In other exemplary embodiments, the graphene layer(s) can be disposed in the 3DIC to provide a heat sink that directs and dissipates heat to peripheral areas of the 3DIC. In some embodiments, the graphene layer(s) are configured to provide both EMI shielding and heat shielding.

Before discussing embodiments of a shielded 3DIC that includes a thermal shield and an EMI shield, a brief overview of a conventional process used in the assembly of a three-dimensional integrated circuit is provided with reference to FIGS. 1A-1D and FIG. 2. The discussion of exemplary embodiments of a three-dimensional integrated circuit with a thermal and EMI shield begins below with reference to FIG. 3.

Figure 1A:
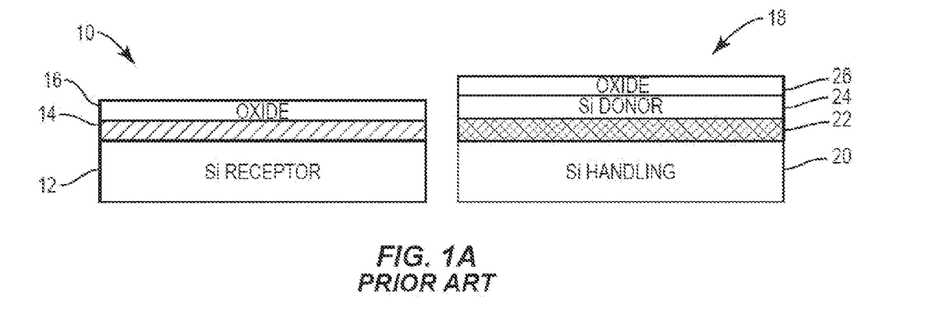
FIGS. 1A-1D illustrate exemplary conventional steps in an ion cutting process to assemble a three-dimensional (3-D) integrated circuit (IC) (3DIC)

In this regard, FIG. 1A illustrates a first step of a conventional process to create a three-dimensional integrated circuit (3DIC). Specifically, a receptor wafer 10 is provided having a substrate 12 such as a silicon (Si) substrate. The substrate 12 may be referred to as a substrate means. A first tier of electronic components (generically indicated at 14) are grown on the substrate 12 as is well known. An oxide layer 16 is grown over the electronic components 14. Concurrently a donor wafer 18 is prepared. The donor wafer 18 may be referred to as a donor means. The donor wafer 18 may also be a silicon material. The donor wafer 18 is implanted with ions to form an ionized region 22, which effectively separates a handling portion 20 from a donor portion 24. Conventional implantation processes allow the creation of a localized, high concentration zone (sometimes called a Delta implant zone). In an exemplary process, the ions are hydrogen ions. An oxide layer 26 is grown on the donor portion 24.

Figure 1B:
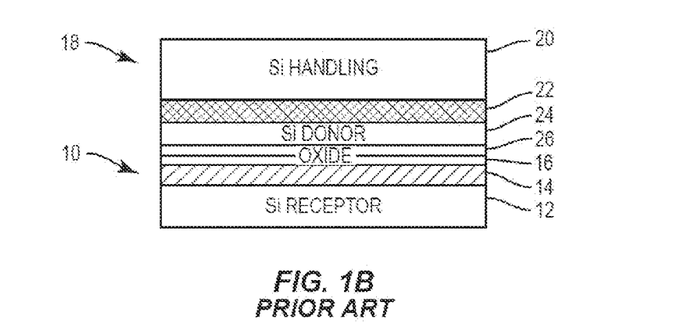
Figure 1C:
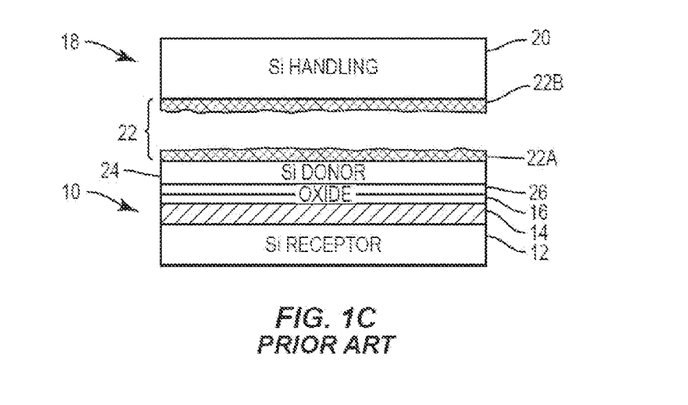

With reference to FIG. 1B, the donor wafer 18 is stacked on top of the receptor wafer 10 such that the oxide layer 16 is in contact with the oxide layer 26. The oxide layers 16, 26 may be referred to as a means for bonding. The oxide layers 16, 26 bond and are annealed through a relatively low temperature process (e.g., between approximately 250° C. and 350° C.). Following annealing, the donor wafer 18 is cleaved from the receptor wafer 10 as illustrated in FIG. 1C. The oxide layer 26, the donor portion 24, and a cleaved portion 22A of the ionized region 22 remain attached to the receptor wafer 10 and a residual portion 22B of the ionized region 22 remains on the handling portion 20 of the donor wafer 18 as is well understood.

Figure 1D:
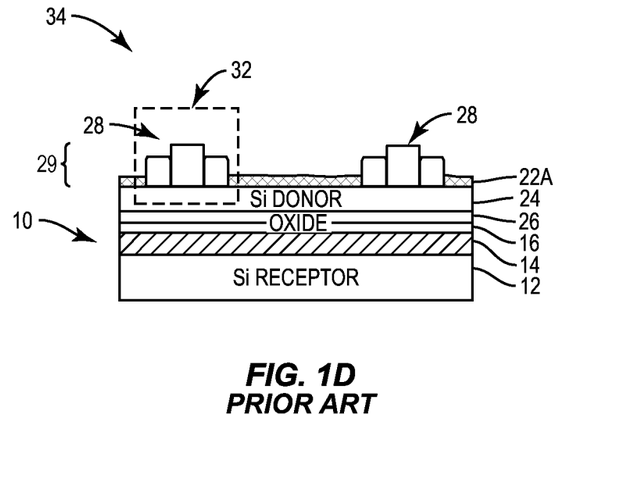

After cleaving, with reference to FIG. 1D additional electronic components 28, such as transistors are grown on the donor portion 24 to form a second tier of electronic components 29. Additional tiers of electronic components beyond the second tier of electronic components 29 (not illustrated) may be created by repeating the process to create a multi-level or multi-tier 3DIC.

Figure 2:
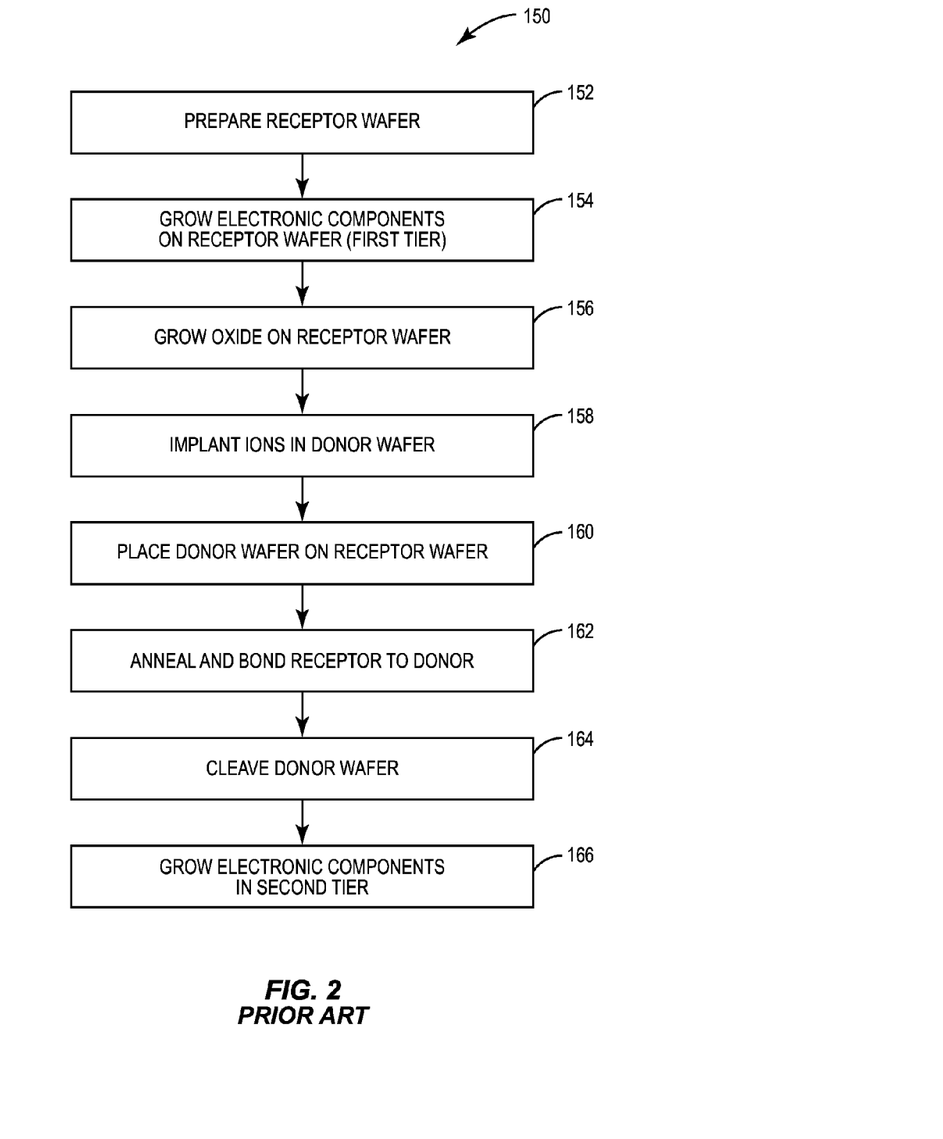
FIG. 2 illustrates a flow chart setting forth an exemplary conventional process for ion cutting.

With FIGS. 1A-1D providing a visual depiction of an exemplary conventional ion cutting process 150, this conventional ion cutting process 150 is further presented in flow chart form in FIG. 2. The conventional ion cutting process 150 begins with the preparation of the receptor wafer 10 (block 152). Preparation of the receptor wafer 10 involves preparing the substrate 12 and may involve doping, curing, cutting, or other techniques as is well understood. Once prepared, a first tier of electronic components 14 are grown on the receptor wafer 10 (block 154). Once the electronic components 14 are grown, an oxide layer 16 is grown on the receptor wafer 10 (block 156, see also FIG. 1A).

With continued reference to FIG. 2, concurrently or sequentially, ions are implanted in the donor wafer 18 to form the ionized region 22 (block 158, see also FIG. 1A). As noted above, the ions are, in an exemplary embodiment, hydrogen ions. Oxide layer 26 is grown on the donor wafer 18 as well. The donor wafer 18 is placed on the receptor wafer 10 (block 160, see also FIG. 1B). The donor wafer 18 is annealed (typically at a temperature range of approximately 250 to 350° C.) (block 162), fusing the oxide layers 16, 26. The annealing takes place until cracking of the ionized region 22 takes place, which enables the transfer of a donor portion 24 and cleaved portion 22A from the donor wafer 18 to the receptor wafer 10. This transfer is referred to as cleaving the donor wafer 18 (block 164, see also FIG. 1C). In exemplary methodologies the donor portion 24 is approximately 1.3 µm thick. Following the transfer, a second tier of electronic components 29 may be grown on the donor portion 24 (block 166, see also FIG. 1D).

In conventional processes such as that shown in FIG. 2 resulting in the 3DIC 26, heat may accumulate within the 3DIC as the electronic components within the tiers of electronic components 14, 29 consume power. Likewise, electronic components within a first tier of electronic components 14 may have crosstalk with electronic components within a second tier of electronic components 29 and vice versa. As the number of tiers of electronic components increases, the heat and crosstalk issues are exacerbated. Failure to dissipate heat negatively impacts the 3DIC by changing the conductivity of the materials in the 3DIC and, if the heat is too great, the materials may melt and reflow in such a manner that the 3DIC is ruined. Likewise, crosstalk, while not likely to destroy the device, causes signals intended for the operation of a first device to show up in a second device, causing the second device to operate in an undesired manner. Alternatively, such crosstalk may exceed relevant laws and regulations (e.g., the Federal Communications Commission (FCC) imposes limits on the amount of EMI radiation a device may emit). Failure to comply with such laws and regulations may mean that the device cannot be sold in certain jurisdictions or markets (e.g., failure to comply with FCC rules means that the device may not operate in the US). The present disclosure addresses these issues by providing an EMI shield between tiers of electronic components. In an exemplary embodiment, the EMI shield is a graphene layer. As noted above, a graphene layer is a sheet like layer made of pure carbon, at least one atom thick with atoms arranged in a regular hexagonal pattern. Graphene is ten times as thermally conductive as copper and has one hundred times the electron mobility of silicon and accordingly, acts as both a thermal shield and an EMI shield that reduces crosstalk.

Figure 3:
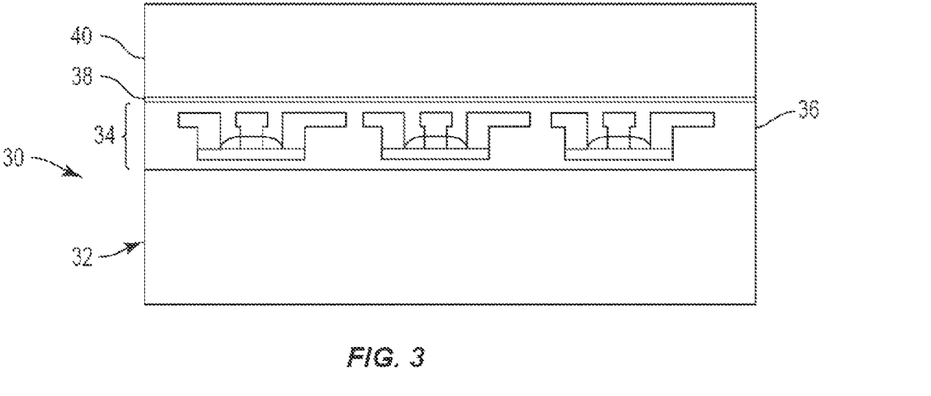
FIG. 3 illustrates an exemplary graphene transfer in the construction of a 3DIC.

In this regard, FIG. 3 illustrates an under construction 3DIC 30 with a substrate 32. In an exemplary embodiment, the substrate 32 may be silicon. A first tier of electronic components 34 have been created on the substrate 32 using conventional processes. A layer of oxide 36 may encapsulate or top the first tier of electronic components 34. A layer of graphene 38 is applied to the layer of oxide 36 using a polymethyl methacrylate (PMMA) holding substrate 40. Use of such PMMA holding substrates 40 to transfer graphene is understood within the art. In an exemplary embodiment, the layer of graphene 38 is formed from a layer of graphene a single atom thick. In another exemplary embodiment, the layer of graphene is formed from a layer of graphene more than one atoms thick (i.e, a bi-layer). It should be noted that for the layer of graphene 38 to be an effective EMI shield, the layer of graphene 38 is not electrically connected to any component within the first tier of electronic components 34. That is, the layer of graphene 38 is electrically isolated from the components within the first tier of electronic components 34.

Figure 4:
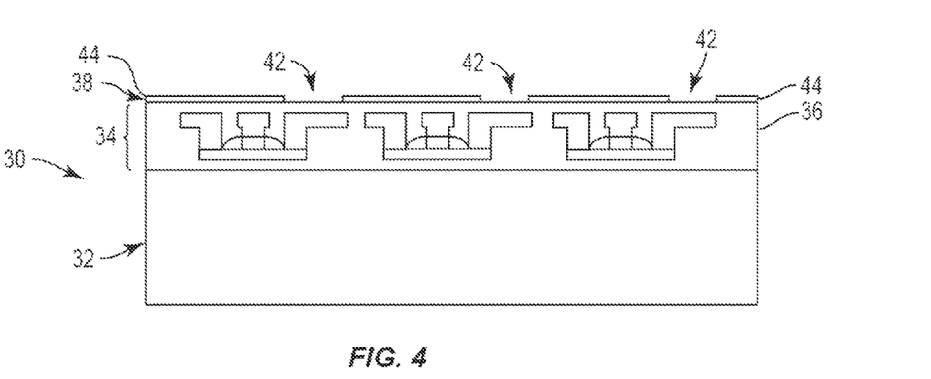
FIG. 4 illustrates an exemplary etching step in the construction of a 3DIC.

The PMMA holding substrate 40 is removed and the layer of graphene 38 is etched into a pattern that includes one or more apertures 42 as illustrated in FIG. 4. In an exemplary embodiment, the apertures 42 are proximate an edge 44 of the under construction 3DIC 30. In another exemplary embodiment, the apertures 42 are spaced inwardly from the edge 44 of the under construction 3DIC 30. In an exemplary embodiment, the etching may be performed through any conventional technique as desired. In another exemplary embodiment, the apertures 42 are made through some process other than etching.

Figure 5:
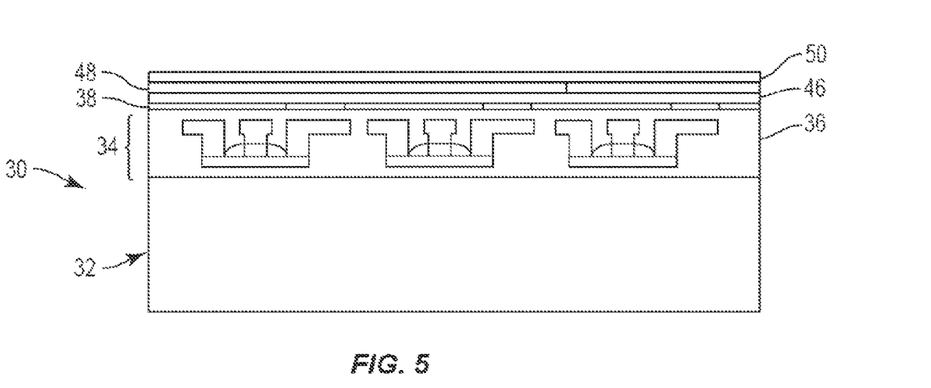
FIG. 5 illustrates an exemplary silicon transfer step in the construction of a 3DIC.

With reference to FIG. 5, an oxide layer 46 is grown over the layer of graphene 38 and used to bond to another layer of silicon 48 through an ion cut process. The top 50 of the layer of silicon 48 may be subjected to a chemical mechanical polish and oxidation process to remove excess ions as described in U.S. patent application Ser. No. 13/765,080, entitled "Ion Reduced, Ion Cut-Formed Three-Dimensional Integrated Circuits (3DICs), And Related Methods and Systems", filed Feb. 12, 2013. The new layer of silicon 48 may be doped (e.g., p-doping, n-doping) as desired. Still other well known preparatory steps may be included in the ion cutting process.

Figure 6:
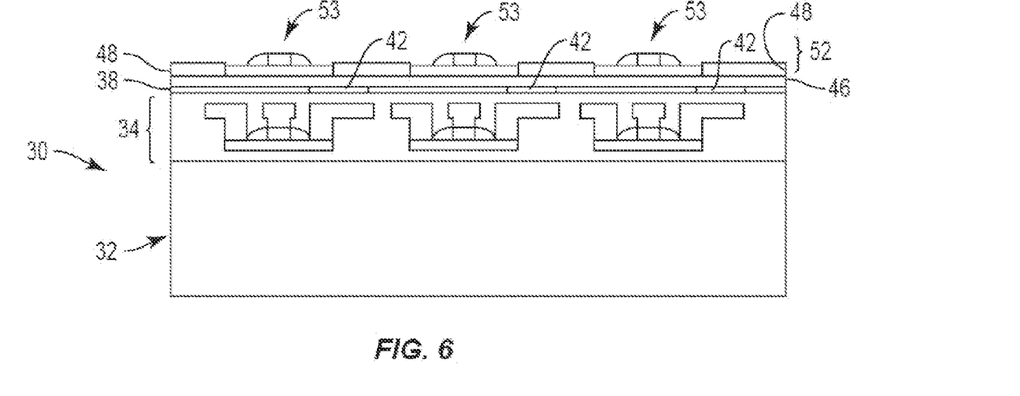
FIG. 6 illustrates an exemplary second tier creation step in the construction of a 3DIC.

With reference to FIG. 6, a second tier of electronic components 52 are grown on the under construction 3DIC 30 and in particular grown on the layer of silicon 48. Individual components 53 may be positioned relative to apertures 42 to effectuate vias as will be explained below with reference to FIGS. 7 and 8. It should be noted that for the layer of graphene 38 to be an effective EMI shield, the layer of graphene 38 is not electrically connected to any component 53 within the second tier of electronic components 52. That is, the layer of graphene 38 is electrically isolated from the components 53 within the second tier of electronic components 52.

Figure 7:
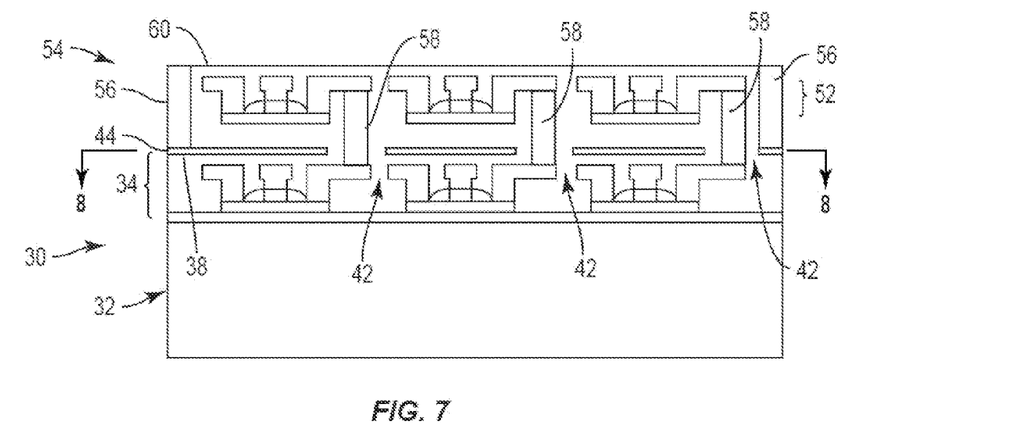
FIG. 7 illustrates an exemplary completed 3DIC including a graphene shield.

With reference to FIG. 7, a completed 3DIC 54 is illustrated. The completed 3DIC 54 includes thermal vias 56 positioned proximate the edge 44. The layer of graphene 38 is an excellent heat conductor, and together with the thermal vias 56, heat may be conveyed from the center of the 3DIC 54 to an edge 44 and dissipated. In an exemplary embodiment, the thermal vias are directly connected to the layer of graphene 38 such that heat may pass from the layer of graphene 38 to the thermal via 56. The placement of the thermal vias 56 proximate the edge 44 allows heat to dissipate from the edge of the completed 3DIC 54. Such heat dissipation effectively removes heat from the center portions of the completed 3DIC 54 and protects the completed 3DIC 54 from overheating. Additionally, inter-tier connect vias 58 may be positioned interiorly spaced relative to the edge 44 to connect individual components in the first tier of electronic components 34 with individual components in the second tier of electronic components 52. The inter-tier connect vias 58 extend through the apertures 42. In an exemplary embodiment, the layer of graphene 38 is connected to ground (not illustrated). By grounding the layer of graphene 38, an effective EM shield is created.

Figure 8:
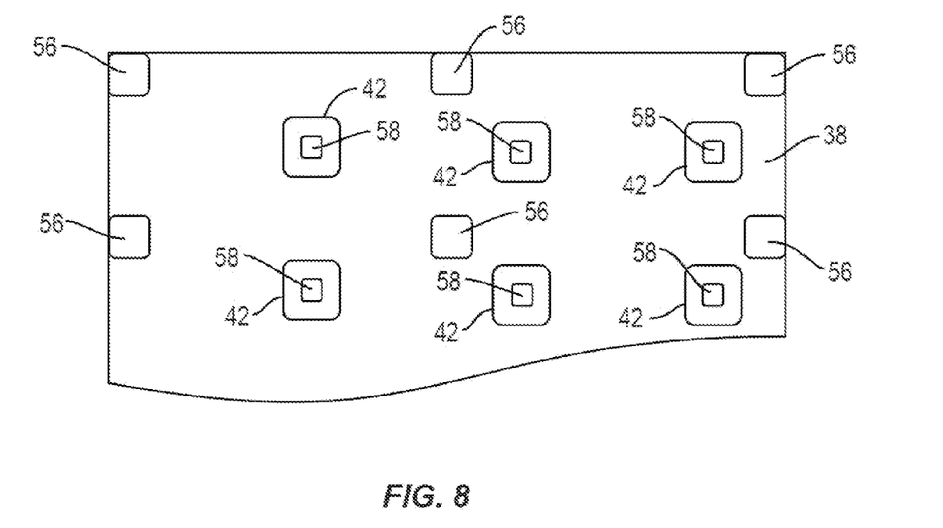
FIG. 8 illustrates an exemplary cross-sectional view of the 3DIC of FIG. 7 taken along lines 8-8.

A cross-sectional view of the completed 3DIC 54 is illustrated in FIG. 8. As illustrated, the completed 3DIC 54 may include interior thermal vias 56 (one shown) as well as the interiorly positioned inter-tier connect vias 58. As illustrated in both FIGS. 7 and 8, the inter-tier connect vias 58 are spaced from the edges of the apertures 42 so that there is no electrical connection between the layer of graphene 38 and the inter-tier connect vias 58. Preservation of the electrical isolation between the inter-tier connect vias 58 and the layer of graphene 38 helps preserve the EM shielding function of the layer of graphene 38.

While not illustrated, it should be appreciated that additional tiers may be grown on top of the second tier of electronic components 52. Such additional tiers may also have a shield positioned therebetween as discussed herein. As a further note, while graphene is described in the exemplary embodiments herein, other substances may also be used as the shield. However, graphene is well suited for the purpose outlined herein because of its combination of thermal conductivity and electron mobility. Accordingly, other suitable materials may include those having a thermal conductivity at least five times greater than copper and an electron mobility at least fifty times greater than silicon.

Figure 9:
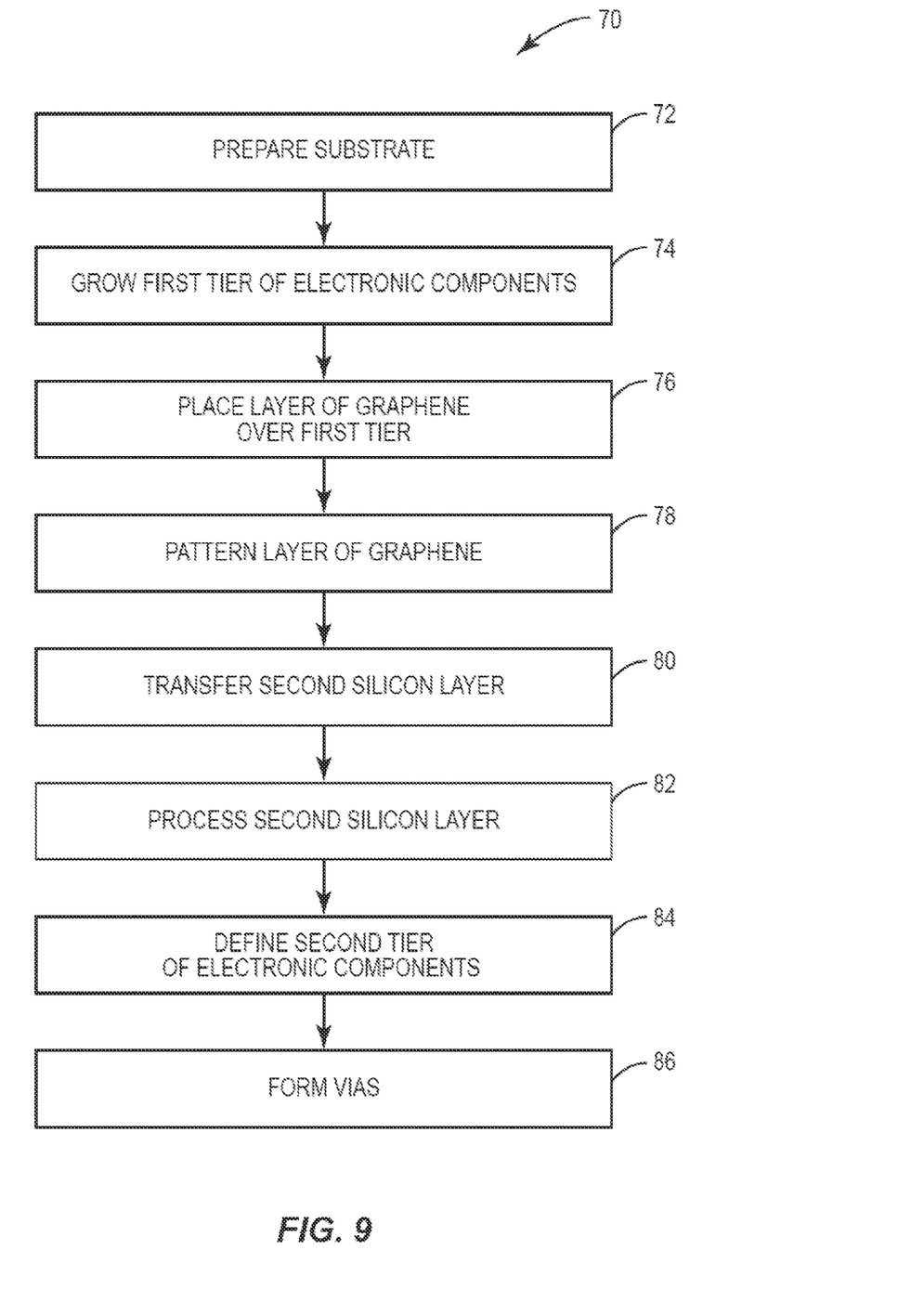
FIG. 9 is a flowchart illustrating an exemplary process for the construction of a 3DIC as illustrated in FIGS. 3-8.

The process 70 of forming the completed 3DIC 54 is summarized with reference to FIG. 9. The process 70 begins with the substrate 32 being prepared (block 72). Such preparation may include doping, creation of isolation trenches and the like as is well understood. The process 70 continues with the growth of the first tier of electronic components 34 (block 74). Such growth may be done through epitaxial growth, vapor deposition, etching, or the like as is well understood.

With continued reference to FIG. 9, the process 70 continues by placing a layer of graphene 38 over the first tier of electronic components 34 (block 76). The layer of graphene 38 may be transferred through the use of a PMMA holding substrate 40 as previously described. The process 70 continues with the apertures 42 created in the layer of graphene 38 through a predefined pattern (block 78). The apertures 42 may be created through etching or similar process as desired.

With continued reference to FIG. 9, the process continues by transferring the second silicon layer 48 over the layer of graphene 38 (block 80). The second silicon layer 48 may be transferred through an ion cutting process as is well known. The second silicon layer 48 may be processed (block 82) to remove ions, smooth the surface and otherwise prepare the second silicon layer 48 for the second tier of electronic components 52. That is, after processing the second silicon layer 48, the second tier of electronic components 52 is defined (block 84). The definition of the second tier of electronic components 52 may be through epitaxial growth, vapor deposition, etching, or the like as is well understood. The vias 56 and 58 are then formed (block 86) and the completed 3DIC 54 of FIG. 7 is finished. Additional tiers of electronic components with additional shielding layers may be provided if desired.

The 3DIC with graphene shield according to embodiments disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 10:
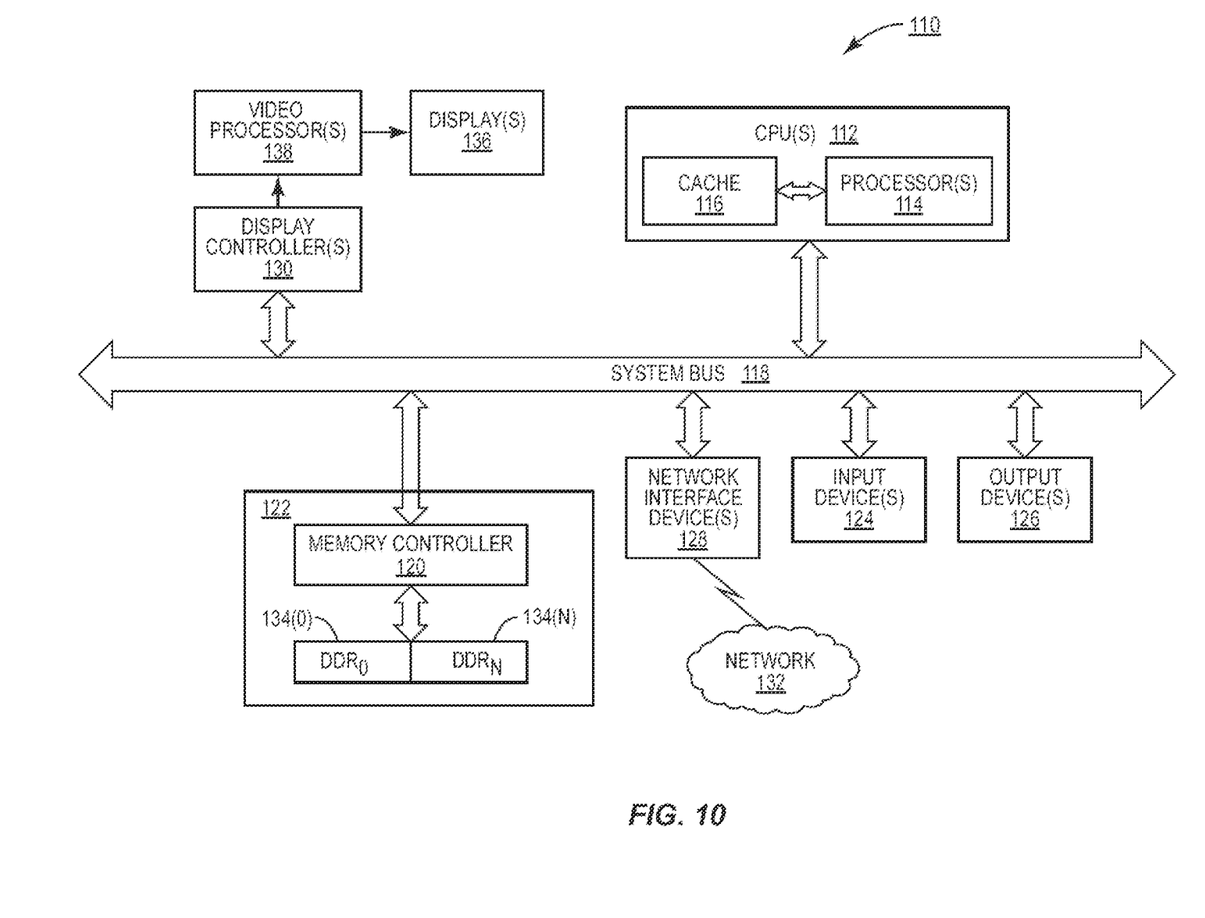
FIG. 10 is a block diagram of an exemplary processor-based system that can include the shielded 3DIC of FIG. 8.

In this regard, FIG. 10 illustrates an example of a processor-based system 110 that can employ a 3DIC. In this example, the processor-based system 110 includes one or more central processing units (CPUs) 112, each including one or more processors 114. The CPU(s) 112 may have cache memory 116 coupled to the processor(s) 114 for rapid access to temporarily stored data. The CPU(s) 112 is coupled to a system bus 118 and can intercouple master devices and slave devices included in the processor-based system 110.

As is well known, the CPU(s) 112 communicates with these other devices by exchanging address, control, and data information over the system bus 118. For example, the CPU(s) 112 can communicate bus transaction requests to the memory controller 120. Although not illustrated in FIG. 10, multiple system buses 118 could be provided, wherein each system bus 118 constitutes a different fabric.

Other devices can be connected to the system bus 118. As illustrated in FIG. 10, these devices can include a memory system 122, one or more input devices 124, one or more output devices 126, one or more network interface devices 128, and one or more display controllers 130, as examples. The input device(s) 124 can include any type of input device, including but not limited to input keys, switches, voice processors, etc. The output device(s) 126 can include any type of output device, including but not limited to audio, video, other visual indicators, etc. The network interface device(s) 128 can be any devices configured to allow exchange of data to and from a network 132. The network 132 can be any type of network, including but not limited to a wired or wireless network, private or public network, a local area network (LAN), a wide local area network (WLAN), and the Internet. The network interface device(s) 128 can be configured to support any type of communication protocol desired. The memory system 122 can include one or more memory units 134(0-N).

The CPU(s) 112 may also be configured to access the display controller(s) 130 over the system bus 118 to control information sent to one or more displays 136. The display controller(s) 130 sends information to the display(s) 136 to be displayed via one or more video processors 138, which process the information to be displayed into a format suitable for the display(s) 136. The display(s) 136 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The arbiters, master devices, and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a processor, a DSP, an Application Specific Integrated Circuit (ASIC), an FPGA or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A monolithic three-dimensional (3-D) integrated circuit (3DIC), comprising:
   a first semiconductor integrated circuit tier comprising a first one or more active components;
   a second semiconductor integrated circuit tier comprising a second one or more active components vertically positioned relative to the first semiconductor integrated circuit tier; and
   at least one graphene layer disposed between the first and second semiconductor integrated circuit tiers and extending from a first exterior edge of the monolithic 3DIC to a second opposite exterior edge of the monolithic 3DIC, the at least one graphene layer electrically isolated from all active components in the first and second semiconductor integrated circuit tiers, wherein the at least one graphene layer is coupled to ground.

2. The monolithic 3DIC of claim 1, wherein the at least one graphene layer provides electromagnetic shielding between the first and second semiconductor integrated circuit tiers.

3. The monolithic 3DIC of claim 1, wherein the at least one graphene layer is configured to conduct heat away from interiorly positioned active elements within the first and second semiconductor integrated circuit tiers.

4. The monolithic 3DIC of claim 1, wherein the at least one graphene layer defines at least one aperture.

5. The monolithic 3DIC of claim 4, further comprising a conductive via passing through the at least one aperture and coupling a first active component of the first one or more active components in the first semiconductor integrated circuit tier and a second active component of the second one or more active components in the second semiconductor integrated circuit tier.

6. The monolithic 3DIC of claim 1, further comprising a thermal via thermally contiguous to the at least one graphene layer.

7. The monolithic 3DIC of claim 4, wherein the at least one aperture is proximate the first exterior edge.

8. The monolithic 3DIC of claim 4, wherein the monolithic 3DIC comprises a center and the at least one aperture is proximate the center.

9. The monolithic 3DIC of claim 4, wherein the at least one aperture is spaced inwardly from the first exterior edge.

10. The monolithic 3DIC of claim 7, further comprising a thermal via positioned proximate the first exterior edge.

11. The monolithic 3DIC of claim 1, further comprising a bonding layer bonding the first semiconductor integrated circuit tier to the second semiconductor integrated circuit tier and wherein the at least one graphene layer is positioned below the bonding layer.

12. The monolithic 3DIC of claim 11, wherein the bonding layer comprises an annealed oxide layer.

13. The monolithic 3DIC of claim 1 integrated into a semiconductor die.

14. The monolithic 3DIC of claim 1, further comprising a device selected from the group consisting of: a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player, into which the monolithic 3DIC is integrated.

15. A monolithic three-dimensional (3-D) integrated circuit (3DIC), comprising:
   a first means for providing a semiconductor tier comprising a first one or more active components;
   a second means for providing a semiconductor tier comprising a second one or more active components vertically positioned relative to the first means for providing the semiconductor tier; and
   at least one graphene layer disposed between the first and second means for providing the semiconductor tiers and extending from a first exterior edge of the monolithic 3DIC to a second opposite exterior edge of the monolithic 3DIC, the at least one graphene layer electrically isolated from all active components in the semiconductor tiers, wherein the at least one graphene layer is coupled to ground.

* * * * *